(12) United States Patent
Sugimoto

(10) Patent No.: US 10,375,842 B2
(45) Date of Patent: Aug. 6, 2019

(54) REMOTE CONTROL

(71) Applicant: SMK Electronics (Dongguan) Co., Ltd., Guangdong (CN)

(72) Inventor: Kohei Sugimoto, Dongguan (CN)

(73) Assignee: SMK Electronics (Dongguan) Co., Ltd., Guangdong (CN)

( * ) Notice: Subject to any disclaimer, the term of this patent is extended or adjusted under 35 U.S.C. 154(b) by 0 days.

(21) Appl. No.: 15/972,220

(22) Filed: May 6, 2018

(65) Prior Publication Data

US 2018/0324962 A1 Nov. 8, 2018

Related U.S. Application Data

(63) Continuation of application No. PCT/CN2017/113416, filed on Nov. 28, 2017.

(30) Foreign Application Priority Data

| May 5, 2017 | (CN) | 2017 2 0493819 U |
| Jun. 6, 2017 | (CN) | 2017 1 0418449 |
| Apr. 13, 2018 | (JP) | 2018-077512 |
| Apr. 19, 2018 | (CN) | 2018 1 0354789 |

(51) Int. Cl.

| G06F 1/16 | (2006.01) |
| H05K 5/00 | (2006.01) |
| H05K 7/00 | (2006.01) |
| H01R 13/66 | (2006.01) |
| G05B 19/02 | (2006.01) |
| H01R 13/502 | (2006.01) |
| H01H 25/04 | (2006.01) |
| H01H 9/02 | (2006.01) |

(52) U.S. Cl.
CPC ........... *H05K 5/0069* (2013.01); *G05B 19/02* (2013.01); *H01H 25/041* (2013.01); *H01R 13/502* (2013.01); *H01R 13/665* (2013.01); *H05K 5/0017* (2013.01); *H05K 5/0082* (2013.01); *H01H 9/0235* (2013.01); *H01H 2025/048* (2013.01)

(58) Field of Classification Search
CPC .............................. H05K 5/0069; G05B 19/02
USPC .................................................... 361/679.01
See application file for complete search history.

(56) References Cited

U.S. PATENT DOCUMENTS 4,394,546 A * 7/1983 Harumatsu ............ H01H 13/70
200/314
8,564,937 B2 * 10/2013 Ladouceur ........... H01H 13/705
361/679.01

(Continued)

FOREIGN PATENT DOCUMENTS

| JP | 2007266731 A | 10/2007 |
| JP | 2014216836 A | 11/2014 |

*Primary Examiner* — Anthony M Haughton

(57) ABSTRACT

A remote control is provided. The remote control includes a housing, a fixing part installed in a keyway disposed at the housing and a determination piece and a direction piece which are installed on the fixing part. A direction key, a determination key and a program writing piece each extending to the fixing part are installed in the housing. The program writing piece is provided with a first through-hole through which the determination key extends to the fixing part. The fixing part is further provided with a second through-hole through which the direction key extends and a third through-hole through which the program writing piece extends.

11 Claims, 2 Drawing Sheets

(56) References Cited

U.S. PATENT DOCUMENTS

| | | | |
|---|---|---|---|
| 9,720,575 B2* | 8/2017 | Hatambeiki | G08C 17/02 |
| 2001/0011953 A1* | 8/2001 | Shintani | G05B 19/0426 |
| | | | 340/4.33 |
| 2009/0134003 A1* | 5/2009 | Okidate | H01H 25/04 |
| | | | 200/536 |

* cited by examiner

REMOTE CONTROL

CROSS REFERENCE TO RELATED APPLICATION

The contents of the following Chinese applications, International application and Japanese application are incorporated herein by reference, Chinese Utility Model Application No. 201720493819.5 filed on May 5, 2017, Chinese Patent Application No. 201710418449.3 filed on Jun. 6, 2017, International Application No. PCT/CN2017/113416 filed on Nov. 28, 2017, Japanese Patent Application No. 2018-077512 filed on Apr. 13, 2018, and Chinese Patent Application No. 201810354789.9 filed on Apr. 19, 2018.

FIELD

The present disclosure relates to the technical field of electronic products, and particularly, to a remote control.

BACKGROUND

A remote control, which can control a device at a remote location using electromagnetic signals, is widely applied in fields such as wireless home automation and industrial control. Usually, the remote control is provided with an orientation signal emitter and multiple keys, each key corresponding to one remote controlling function signal. When a user press and trigger any of the keys, the remote controlling function signal corresponding to the pressed key may be emitted. In order to realize such function, program commands corresponding to the function need to be written into a circuit board of the remote control. For most of the electronic products including the remote control, a program writing hole-slot is usually provided at a housing of an electronic product and a program writing piece connected to the circuit board is installed into the program writing hole-slot. Hence, a manufacture process for the remote control is complicated and the mass production of remote controls is of relatively high cost.

The remote control is subjected to the following operation, i.e., in a production line of products, writing a program by using a programmable ROM (referred to as PROM hereinafter) into which the program can be written. A program writing hole is provided at the housing of the remote control. The program writing hole is used to connect a pin-shaped terminal of a writing device to an electrode group for program writing which is arranged on a circuit board provided with the PROM.

Conventionally, the program writing hole is exposed as appearance of the housing, which adversely affects the appearance. In addition, static electricity carried by the user of the remote control may be applied to the electrode group for program writing via the program writing hole, which may probably result in electric breakdown of the PROM.

SUMMARY

The present disclosure provides a remote control. A program writing piece is disposed in a keyway that needs to be provided originally, thereby simplifying production procedure and effectively lowering manufacturing cost.

A remote control is provided. The remote control includes: a housing, a fixing part installed in a keyway of the housing, and a determination piece and a direction piece installed on the fixing part. A direction key, a determination key and a program writing piece each extending to the fixing part are installed in the housing. The program writing piece is provided with a first through-hole through which the determination key extends to the fixing part. The fixing part is further provided with a second through-hole through which the direction key extends and a third through-hole through which the program writing piece extends.

Optionally, the housing is further provided with a locating guide pillar extending to the fixing part and configured to locate the determination piece. The fixing part is provided with a fourth through-hole through which the locating column extends. The fixing part is further provided with a fastening groove for fastening the direction piece and a wedge block is disposed at one side of the fastening groove.

Optionally, the determination piece is provided with a clamping portion extending between the direction piece and the fixing part.

Optionally, the fixing part includes a first step and a second step, the first step and the second step are not located at an identical level. The fastening groove is disposed at the first step, the second through-hole is disposed at a junction between the first step and the second step, and the third through-hole and the fourth through-hole are disposed at the second step.

Optionally, a plurality of fastening grooves are provided and the plurality of fastening grooves are disposed annularly and uniformly at the first step. A plurality of second through-holes are provided and the plurality of second through-holes are disposed annularly and uniformly at the junction between the first step and the second step. A plurality of fourth through-holes are provided and the plurality of fourth through-holes are disposed uniformly. at the second step.

Optionally, four fastening grooves are provided, four second through-holes are provided and four fourth through-holes are provided.

Optionally, the fixing part is connected to the housing in way of threaded connection.

In a mould developing process for the remote control provided in the present disclosure, the program writing piece can be directly disposed in the keyway that needs to be provided originally, thereby saving production time and lowering production cost. In an actual assembling process, since a hole should be prepared in advance for the keyway, it is only required to prepare the hole a little bigger and then to arrange the keys and the program writing piece together into the keyway that is prepared bigger in advance, which simplifies the operations of assemblers, reduces the intensity of labor and improves the productivity.

In addition, since the determination piece and the direction piece are embedded in the fixing part provided with the program writing piece having the third through-hole, the third through-hole is hidden by the determination piece and the direction piece, and thus the program writing piece may not be exposed as appearance, thereby leading to good appearance.

In addition, a user of the remote control may not touch the program writing piece unintentionally, which effectively avoids electric breakdown of the PROM due to static electricity applied from the user.

Furthermore, in a case that it is necessary to rewrite a program, the third through-hole can be exposed by detaching the determination piece and the direction piece from the fixing part and a pin-shaped writing terminal of a writing device can be inserted in and connected to the third through-hole to rewrite the program.

DESCRIPTION OF EMBODIMENTS

Figure 1:
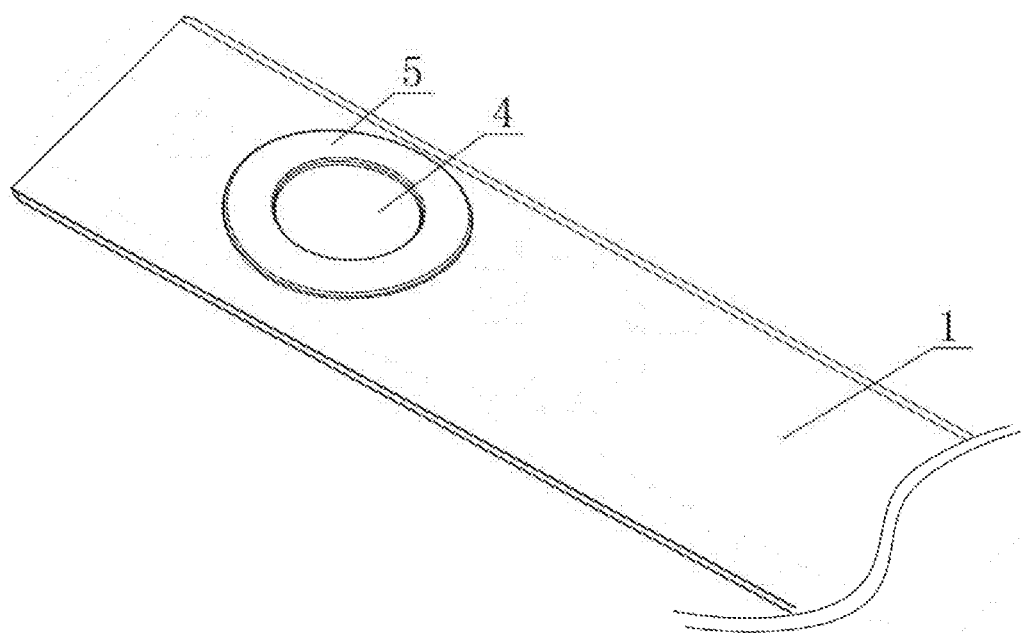
FIG. 1 is a schematic diagram of a stereostructure of remote control according to an embodiment.
Figure 2:
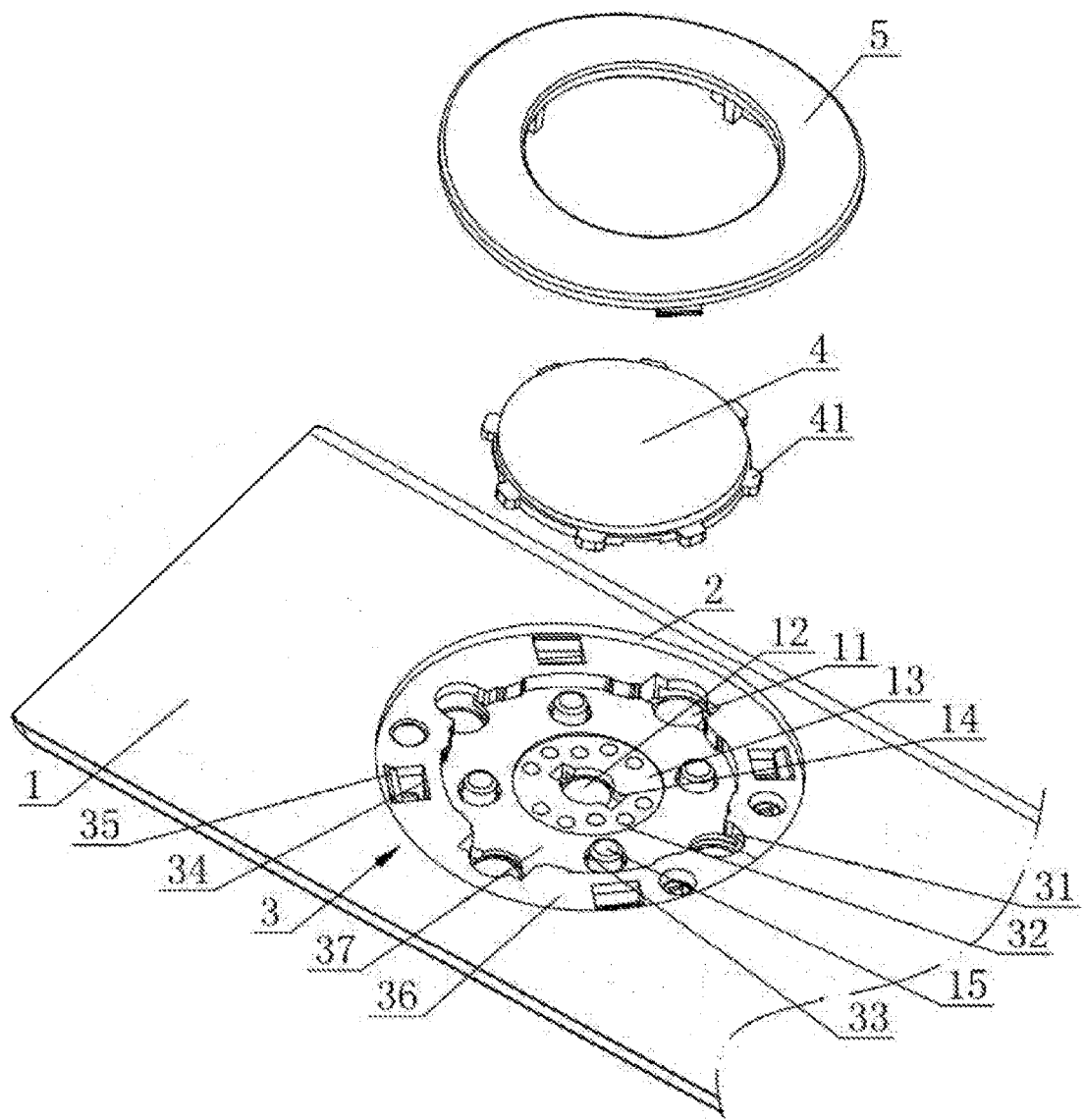
FIG. 2 is an exploded view of stereostructures of a determination piece and a direction piece according to an embodiment.

As shown in FIG. 1 and FIG. 2, a remote control includes: a housing 1, a keyway 2 disposed at the housing 1, a fixing part 3 installed in the keyway 2, and a determination piece 4 and a direction piece 5 installed on the fixing part 3. A direction key 11, a determination key 12 and a program writing piece 13 each extending to the fixing part 3 are installed in the housing 1. The program writing piece 13 is provided with a first through-hole 14 through which the determination key 12 extends to the fixing part 3. The fixing part 3 is further provided with a second through-hole 31 through which the direction key 11 extends and a third through-hole 32 through which the program writing piece 13 extends.

The third through-hole 32 is a program writing hole.

The third through-hole 32 is disposed corresponding to an electrode group for program writing, which is arranged on a circuit board provided with a PROM. The third through-hole 32 is for inserting and connecting a pin-shaped writing terminal of a writing device, thereby writing a specified program conforming with a product specification.

According to the present embodiment, since the determination piece 4 and the direction piece 5 are embedded in the fixing part 3 provided with the program writing piece 13 having the third through-hole 32, the third through-hole 32 is hidden by the determination piece 4 and the direction piece 5, and thus the program writing piece 13 may not be exposed as appearance, thereby leading to good appearance. In addition, a user of the remote control may not touch the program writing piece 13 unintentionally, which effectively avoids electric breakdown of the PROM due to static electricity applied from the user.

Furthermore, in a case that it is necessary to rewrite a program, the third through-hole 32 can be exposed by detaching the determination piece 4 and the direction piece 5 from the fixing part 3, and the pin-shaped writing terminal of the writing device can be inserted in and connected to the third through-hole 32 to rewrite the program.

In a mould developing process for the remote control according to the present embodiment, the program writing piece can be directly disposed in the keyway that needs to be provided originally, thereby saving production time and lowering production cost. In an actual assembling process, since a hole should be prepared in advance for the keyway 2, it is only required to prepare the hole a little bigger and then to install the keys and the program writing piece 13 together into the keyway 2 that is prepared bigger in advance, which simplifies the operation of assemblers, reduces the intensity of labor and improves the productivity.

According to the present embodiment, the housing is provided with a locating guide pillar 15 extending to the fixing part 3 and configured to locate the determination piece 4. The fixing part 3 is provided with a fourth through-hole 33 through which the locating column 15 extends. The fixing part 3 is further provided with a fastening groove 34 for fastening the direction piece 5. A wedge block 35 is disposed at one side of the fastening groove 34. The locating guide pillar 15 secures the determination piece 4 effectively to prevent the determination piece 4 from shifting during use. The direction piece 5 is fastened through the wedge block 35 such that disassembly and maintenance of the remote control are convenient.

According to the present embodiment, the determination piece 4 is provided with a clamping portion 41 extending between the direction piece 5 and the fixing part 3. The determination piece 4 is secured onto the locating guide pillar 15 using a downward stress applied by the wedge block 35 for fastening the direction piece 5. Hence, a fixing member for the determination piece 4 is not necessary, an assembling procedure is simplified and the productivity is improved.

According to the present embodiment, the fixing part 3 includes a first step 36 and a second step 37. The first step 36 and the second step 37 are not located at an identical level. The fastening groove 34 is disposed at the first step 36, the second through-hole 31 is disposed at a junction between the first step 36 and the second step 37, and the third through-hole 32 and the fourth through-hole 33 are disposed at the second step 37. By designing the fixing part 3 with the first step 36 and the second step 37, the cooperation between the determination key 12 and the determination piece 4 and the cooperation between the direction key 11 and the direction piece 5 can be better.

Optionally, according to the present embodiment, four fastening grooves 34 are provided and the four fastening grooves 34 are disposed annularly and uniformly at the first step 36. Four second through-holes 31 are provided and the four second through-holes 31 are disposed annularly and uniformly at the junction between the first step 36 and the second step 37. Four fourth through-holes 33 are provided and the four fourth through-holes 33 are disposed uniformly at the second step 37. The fastening grooves 34 and the fourth through-holes 33 both function as locating the determination piece 4 and the direction piece 5. The second through-holes 31 are disposed corresponding to direction keys 11 indicating "up", "down", "left" and "right" respectively.

According to the present embodiment, the fixing part 3 is connected to the housing 1 in way of threaded connection such that the connection between the fixing part 3 and the housing 1 is more secure, and disassembly and maintenance of the remote control are convenient.

In another embodiment, the fixing part 3 and the housing 1 may be formed integratedly.

It should be noted that, orientations and location relationships indicated by terms such as "center", "lateral direction (X-direction)", "longitudinal direction (Y-direction)", "vertical direction (Z-direction)", "length", "width", "thickness", "up", "down", "front", "rear", "left", "right", "vertical", "horizontal", "top", "bottom", "inner", "outer", "clockwise" and "counterclockwise" used in the description of the embodiment are orientations and location relationships based on the drawings, which are intended to describe the embodiment conveniently and briefly, rather than to indicate or imply that described devices or components must have particular orientation or must be constructed and operated with particular orientations. The terms are not intended to limit specific protection scope of the embodiment.

In addition, terms such as "first" and "second" are merely for description, rather than intended to indicate or imply relative importance or a quantity of a feature. Hence, a feature limited by "first" or "second" may indicate or imply that there is one of that feature or there are multiple of that feature. Unless otherwise defined clearly and specifically, a term of "multiple" in the description of the embodiment means two or more.

Unless otherwise specified or defined clearly, possible terms such as "assemble", "connect to" and "couple to" need to be interpreted broadly. For example, these terms may include fixed connection, detachable connection or integrated connection; may also include mechanical connection; and may include direct connection, connection via a medium or inner communication between two elements. Specific meanings of these terms in the embodiment can be understood based on actual situations.

INDUSTRIAL APPLICABILITY

For the remote control provided in the present disclosure, the program writing piece is disposed in the keyway that needs to be provided originally, thereby simplifying production procedure and effectively lowering manufacturing cost.

The invention claimed is:

1. A program writable remote control, comprising:
   a housing;
   a fixing part installed in a keyway of the housing;
   a determination piece and a direction piece, which are installed on the fixing part; and
   a direction key, a determination key and a program writing piece each extending to the fixing part, wherein the program writing piece is provided with a first through-hole through which the determination key extends to the fixing part and the fixing part is provided with at least one second through-hole through which the direction key extends and a third through-hole through which the program writing piece extends, and
   the program writing piece includes an electrode group that is in electrical communication with a programmable read-only memory (PROM) such that the PROM is programmable through the electrode group.

2. The program writable remote control according to claim 1, wherein the housing is further provided with a guide pillar extending to the fixing part and configured to locate the determination piece, the fixing part is provided with a fourth through-hole through which a locating column extends, and the fixing part is further provided with a fastening groove for fastening the direction piece.

3. The program writable remote control according to claim 2, wherein a wedge block is disposed at one side of the fastening groove.

4. The program writable remote control according to claim 1, wherein the determination piece is provided with a clamping portion extending between the direction piece and the fixing part.

5. The program writable remote control according to claim 1, wherein the fixing part comprises a first step and a second step, the first step and the second step are not located at an identical level, at least one fastening groove, with which the fixing part is further provided for fastening the direction piece, is disposed at the first step, the at least one second through-hole is disposed at a junction between the first step and the second step, and the third through-hole and at least one fourth through-hole, through which a locating column extends, are disposed at the second step.

6. The program writable remote control according to claim 5, wherein
   the at least one fastening groove includes a plurality of fastening grooves that are disposed annularly and uniformly at the first step of the fixing part;
   the at least one second through-hole includes a plurality of second through-holes that are disposed annularly and uniformly at the junction between the first step and the second step of the fixing part; and
   the at least one fourth through-hole includes a plurality of fourth through-holes that are disposed uniformly at the second step.

7. The program writable remote control according to claim 5, wherein the at least one fastening groove includes four fastening grooves, the at least one second through-hole includes four second through-holes, and the at least one fourth through-hole includes four fourth through-holes.

8. The program writable remote control according to claim 1, wherein the fixing part is connected to the housing by way of threaded connection.

9. A program writable remote control, comprising:
   a housing;
   a fixing part disposed to a keyway of the housing, the fixing part and the housing formed integratedly;
   a determination piece and a direction piece, which are installed on the fixing part; and
   a direction key, a determination key and a program writing piece each extending to the fixing part, wherein the program writing piece is provided with a first through-hole through which the determination key extends to the fixing part and the fixing part is provided with a second through-hole through which the direction key extends and a third through-hole through which the program writing piece extends, and
   the program writing piece includes an electrode group that is in electrical communication with a programmable read-only memory (PROM) such that the PROM is programmable through the electrode group.

10. A program writable remote control, comprising a housing, wherein the housing is provided with a fixing part, the fixing part is provided with a program writing piece having a third through-hole configured to receive a writing terminal of a writing device to write a program, and at least one of a determination piece and a direction piece is embedded in the fixing part, wherein
    the program writing piece includes an electrode group that is in electrical communication with a programmable read-only memory (PROM) such that the PROM is programmable through the electrode group.

11. The program writable remote control according to claim 1, wherein the third through-hole is exposable for writing the program by detaching the determination piece and the direction piece from the fixing part.

* * * * *